US011689225B2

(12) United States Patent
Uejima

(10) Patent No.: US 11,689,225 B2
(45) Date of Patent: *Jun. 27, 2023

(54) RADIO FREQUENCY MODULE AND COMMUNICATION DEVICE

(71) Applicant: Murata Manufacturing Co., Ltd., Nagaokakyo (JP)

(72) Inventor: Takanori Uejima, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/732,517

(22) Filed: Apr. 29, 2022

(65) Prior Publication Data

US 2022/0255568 A1 Aug. 11, 2022

Related U.S. Application Data

(63) Continuation of application No. 17/120,305, filed on Dec. 14, 2020, now Pat. No. 11,349,506, which is a (Continued)

(30) Foreign Application Priority Data

Jun. 20, 2018 (JP) ................. 2018-117162

(51) Int. Cl.
*H04B 1/40* (2015.01)
*H04B 1/04* (2006.01)
(Continued)

(52) U.S. Cl.
CPC .......... *H04B 1/0057* (2013.01); *H03F 3/245* (2013.01); *H04B 1/006* (2013.01); *H04B 1/18* (2013.01);
(Continued)

(58) Field of Classification Search
CPC .... H04B 1/0053; H04B 1/0057; H04B 1/006; H04B 1/04; H04B 1/0458; H04B 1/0475;
(Continued)

(56) References Cited

U.S. PATENT DOCUMENTS 6,741,125 B2 * 5/2004 Arai ..................... H03G 3/3042
330/285
6,766,149 B1 * 7/2004 Hikita .................... H03H 9/725
455/552.1

(Continued)

FOREIGN PATENT DOCUMENTS

CN       101401317 A    4/2009
JP       2006-121514 A  5/2006
(Continued)

OTHER PUBLICATIONS

International Search Report and Written Opinion dated Aug. 27, 2019, received for PCT Application PCT/JP2019/023818, Filed on Jun. 17, 2019, 9 pages including English Translation.

(Continued)

*Primary Examiner* — Quochien B Vuong
(74) *Attorney, Agent, or Firm* — Xsensus LLP

(57) ABSTRACT

A radio frequency module includes: a transmission power amplifier that includes a plurality of amplifying elements that are cascaded; a reception low noise amplifier; and a module board on which the transmission power amplifier and the reception low noise amplifier are mounted. The plurality of amplifying elements include: an amplifying element disposed most downstream; and an amplifying element disposed upstream of the amplifying element, and in a plan view of the module board, a conductive member is physically disposed between the amplifying element and the reception low noise amplifier.

20 Claims, 8 Drawing Sheets

Related U.S. Application Data continuation of application No. PCT/JP2019/023818, filed on Jun. 17, 2019.

(51) Int. Cl.
*H04B 1/00* (2006.01)
*H03F 3/24* (2006.01)
*H04B 1/18* (2006.01)
*H04B 1/38* (2015.01)

(52) U.S. Cl.
CPC ......... *H04B 1/38* (2013.01); *H03F 2200/451* (2013.01)

(58) Field of Classification Search
CPC ... H04B 1/18; H04B 1/38; H04B 1/40; H04B 1/44; H04B 1/48; H04B 1/3827; H04B 1/525; H04B 2001/0408; H04W 52/243; H04W 52/52; H04W 88/06; H04M 1/02; H04M 1/026; H04M 1/0274; H03F 1/3205; H03F 3/195; H03F 3/213; H03F 3/245; H03F 2200/165; H03F 2200/171; H03F 2200/245; H03F 2200/451
See application file for complete search history.

(56) References Cited

U.S. PATENT DOCUMENTS

| | | | |
|---|---|---|---|
| 6,961,544 | B1 | 11/2005 | Hagström |
| 6,973,330 | B2* | 12/2005 | Wieck ..................... H04B 1/40 455/558 |
| 8,130,787 | B2 | 3/2012 | Hagiwara et al. |
| 8,483,627 | B2* | 7/2013 | Rajendran ............... H03F 3/195 455/78 |
| 10,271,448 | B2 | 4/2019 | Yuen et al. |
| 10,276,521 | B2 | 4/2019 | Babcock et al. |
| 10,972,069 | B2 | 4/2021 | Matsumoto |
| 2010/0157860 | A1 | 6/2010 | Hagiwara et al. |
| 2018/0041244 | A1 | 2/2018 | Ding et al. |

FOREIGN PATENT DOCUMENTS

| | | |
|---|---|---|
| JP | 2013-59033 A | 3/2013 |
| KR | 10-2015-0142280 A | 12/2015 |
| WO | 2006/112306 A1 | 10/2006 |
| WO | 2007/083668 A1 | 7/2007 |
| WO | 2018/043162 A1 | 3/2018 |

OTHER PUBLICATIONS

Translation of the Written Opinion dated Aug. 27, 2019, received for PCT Application PCT/JP2019/023818, Filed on Jun. 17, 2019, 8 pages.

Office Action dated Jun. 7, 2021, in corresponding Chinese patent Application No. 201990000796.7, 5 pages.

Korean Office Action dated Jan. 14, 2022, in corresponding Korean Patent Application No. 10-2020-7035309, 11 pages.

\* cited by examiner

RADIO FREQUENCY MODULE AND COMMUNICATION DEVICE

CROSS-REFERENCE TO RELATED APPLICATIONS

The present application is a continuation of U.S. application Ser. No. 17/120,305, filed Dec. 14, 2020, which is a continuation application of PCT International Application No. PCT/JP2019/023818 filed on Jun. 17, 2019, designating the United States of America, which is based on and claims priority of Japanese Patent Application No. 2018-117162 filed on Jun. 20, 2018. The entire disclosures of the above-identified applications, including the specifications, drawings and claims are incorporated herein by reference in their entirety.

TECHNICAL FIELD

The present disclosure relates to a radio frequency (RF) module and a communication device.

BACKGROUND

In mobile communication apparatuses such as mobile phones, the arrangement of circuit elements included in radio frequency front-end circuits has been made complicated along with the development in multiband technology, in particular.

Japanese Unexamined Patent Application Publication No. 2006-121514 discloses a high frequency radio unit (a radio frequency module) having a configuration in which a receiver low noise amplifier (a reception low noise amplifier) and a transmitter power amplifier (a transmission power amplifier) are connected via an antenna switch. The low noise amplifier and the power amplifier each include, for example, cascaded amplifying elements, but share a component such as a bias circuit, thus reducing the number of components of the high frequency radio unit.

SUMMARY

Technical Problems

However, as recognized by the present inventor, when the high frequency radio unit (the radio frequency module) disclosed in Japanese Unexamined Patent Application Publication No. 2006-121514 is achieved by a single module as a compact front-end circuit of a mobile communication apparatus, the power amplifier (the transmission power amplifier) and the low noise amplifier (the reception low noise amplifier) are adjacent to each other. In particular, when the power amplifier includes cascaded amplifying elements, if a downstream amplifying element that outputs high power and the low noise amplifier are adjacent to each other, a harmonic component of a high-power radio frequency signal output from the downstream amplifying element and/or an intermodulation distortion component resulting from the radio frequency signal and another radio frequency signal flow(s) into the low noise amplifier, and consequently the reception sensitivity of a reception path on which the low noise amplifier is disposed deteriorates, which is a problem.

The present disclosure has been conceived in order to solve the above-identified and other problems, and provides a radio frequency module and a communication device that reduce deterioration of reception sensitivity.

Solutions

In order to provide such a radio frequency module, a radio frequency module according to an aspect of the present disclosure includes: a first transmission power amplifier that includes a plurality of amplifying elements that are cascaded; a first reception low noise amplifier; and a module board on which the first transmission power amplifier and the first reception low noise amplifier are mounted. The plurality of amplifying elements include: a first amplifying element disposed most downstream (in reference to a direction of a signal flow through the amplifying elements) of the plurality of amplifying elements; and a second amplifying element disposed upstream (in reference to the signal flow direction) of the first amplifying element, and in a plan view of the module board, a conductive member is physically disposed between the first amplifying element and the first reception low noise amplifier.

Advantageous Effects

According to the present disclosure, a radio frequency module and a communication device that reduce deterioration of reception sensitivity can be provided.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
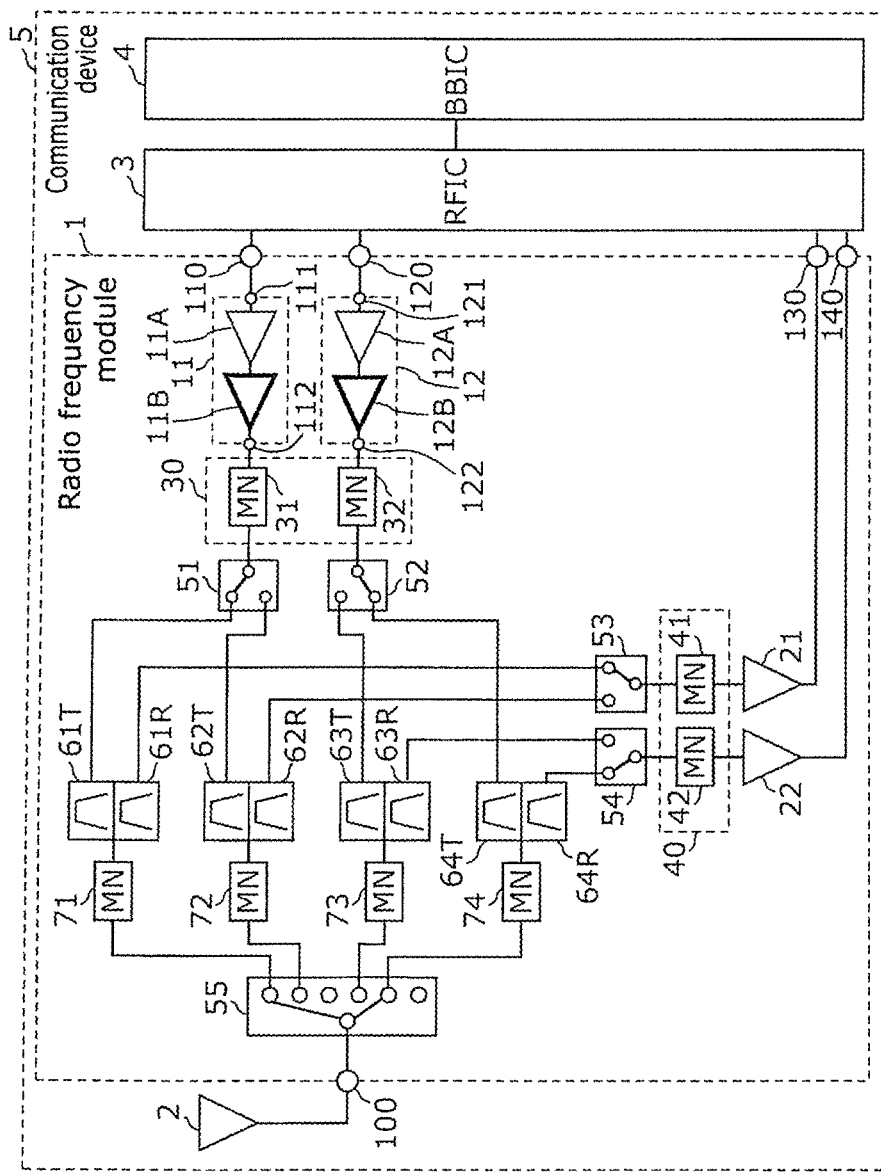
FIG. 1 illustrates a circuit configuration of a communication device according to Embodiment 1.

The following describes in detail embodiments of the present disclosure and variations thereof with reference to the drawings. Note that the embodiments and variations thereof described below each show a general or specific example. The numerical values, shapes, materials, elements, and the arrangement and connection of the elements, for instance, described in the following embodiments and variations thereof are examples, and thus are not intended to limit the present disclosure. Among the elements in the following embodiments and variations thereof, elements not recited in any of the independent claims are described as arbitrary elements. In addition, the sizes of elements and the ratios of the sizes illustrated in the drawings are not necessarily accurate.

Note that in the following, regarding A, B, and C mounted on a board, "C is disposed between A and B in a plan view of the board (or a principal surface of the board)" defines that at least a portion of the region occupied by C projected in the plan view of the board overlaps a line that connects an arbitrary point in the region occupied by A projected in the plan view of the board and an arbitrary point in the region occupied by B projected in the plan view of the board.

Embodiment 1

[1.1 Circuit Configuration of Radio Frequency Module 1 and Communication Device 5]

FIG. 1 illustrates a circuit configuration of radio frequency module 1 according to Embodiment 1. As illustrated in FIG. 1, communication device 5 includes radio frequency module 1, antenna 2, radio frequency (RF) signal processing circuit (RF integrated circuit (RFIC)) 3, and baseband signal processing circuit (BB integrated circuit (BBIC)) 4. In this exemplary configuration the communication device 5 is a multi-band transceiver. As used in this specification the term "module", as used with "radio frequency module", or "RF front-end module" should be construed as circuitry (programmable, as well as discrete) and associated circuit components, such as circuit boards, RF shielding, etc.

RFIC 3 is an RF signal processing circuit that processes radio frequency signals transmitted and received by antenna 2. Specifically, RFIC 3 processes a radio frequency signal input through a reception path of radio frequency module 1 by down-conversion, for instance, and outputs a reception signal generated by being processed to BBIC 4. RFIC 3 processes a transmission signal input from BBIC 4 by up-conversion, for instance, and outputs a radio frequency signal generated by being processed to a transmission path of radio frequency module 1. In the following, a "transmission path" or "transmission signal path" means a transfer route that includes, for instance, a line through which a radio frequency transmission signal propagates, an electrode directly connected to the line, and a terminal directly connected to the line or the electrode. Further, a "reception path" means a transfer route that includes, for instance, a line through which a radio frequency reception signal propagates, an electrode directly connected to the line, and a terminal directly connected to the line or the electrode. In addition, a "transmission and reception path" means a transfer route that includes, for instance, a line through which a radio frequency transmission signal and a radio frequency reception signal propagate, an electrode directly connected to the line, and a terminal directly connected to the line or the electrode. Furthermore, as used herein the terms "circuit" or "circuitry" means one or more circuits, including discrete circuit(s) as well as circuit board(s) and combinations thereof.

BBIC 4 is a circuit that processes signals using an intermediate frequency band lower than the frequency range of a radio frequency signal that propagates in radio frequency module 1. A signal processed by BBIC 4 is used, for example, as an image signal for image display or as an audio signal for talk through a loudspeaker.

RFIC 3 also functions as a controller that controls connection made by switches 51, 52, 53, 54, and 55 included in radio frequency module 1, based on a communication band (a frequency band) to be used. Specifically, RFIC 3 changes connection made by switches 51 to 55 included in radio frequency module 1 according to a control signal (not illustrated). Note that the controller may be disposed outside of RFIC 3, in radio frequency module 1 or BBIC 4, for example.

Antenna 2 is connected to antenna connection terminal 100 of radio frequency module 1, radiates a radio frequency signal output from radio frequency module 1, and receives and outputs a radio frequency signal from the outside to radio frequency module 1.

Note that antenna 2 and BBIC 4 are not necessarily included in communication device 5 according to the present embodiment.

Next, a detailed configuration of radio frequency module 1 is to be described.

As illustrated in FIG. 1, radio frequency module 1 includes common terminal 100, transmission input terminals 110 and 120, reception output terminals 130 and 140, transmission power amplifiers 11 and 12, reception low noise amplifiers 21 and 22, transmission filters 61T, 62T, 63T, and 64T, reception filters 61R, 62R, 63R, and 64R, transmission output matching circuit 30, reception input matching circuit 40, matching circuits 71, 72, 73, and 74, and switches 51, 52, 53, 54, and 55.

Common terminal 100 is connected to antenna 2.

Transmission power amplifier 11 is a first transmission power amplifier that receives input of radio frequency signals through transmission input terminal 110, preferentially amplifies radio frequency signals of communication band A (a first communication band) and communication band B that belong to a first frequency band group, and outputs the amplified radio frequency signals toward common terminal 100.

Transmission power amplifier 12 is a second transmission power amplifier that receives input of radio frequency signals through transmission input terminal 120, preferentially amplifies radio frequency signals of communication band C (a second communication band) and communication band D that belong to a second frequency band group having higher frequency bands than the first frequency band group, and outputs the amplified radio frequency signals toward common terminal 100. Transmission power amplifiers 11 and 12 are power amplifiers, for example.

Transmission power amplifier 11 includes amplifier input terminal 111, amplifier output terminal 112, and amplifying elements 11A and 11B. Amplifying elements 11A and 11B are connected between amplifier input terminal 111 and amplifier output terminal 112, and are cascaded (tandemly connected) to each other. Amplifying element 11B is a first amplifying element disposed downstream out of amplifying elements 11A and 11B, and amplifying element 11A is a second amplifying element disposed upstream of amplifying element 11B.

Transmission power amplifier 12 includes amplifier input terminal 121, amplifier output terminal 122, and amplifying elements 12A and 12B. Amplifying elements 12A and 12B are connected between amplifier input terminal 121 and amplifier output terminal 122, and are cascaded (tandemly connected) to each other. Amplifying element 12B is a first amplifying element disposed downstream out of amplifying elements 12A and 12B, and amplifying element 12A is a second amplifying element disposed upstream of amplifying element 12B. While the present embodiment shows cascaded amplifying elements as being directly connected to one another (i.e., output of one amplifying element directly connected to an input of another amplifying element) it should be understood that "cascade" or "cascaded" should be construed broadly to include one or more intervening passive components and/or transmission line(s)).

Amplifying elements 11A, 11B, 12A, and 12B each include, for example, a field effect transistor or a bipolar transistor made of a complementary metal oxide semiconductor (CMOS) or gallium arsenide (GaAs). Note that amplifying elements 11A and 12A that do not require power handling each include a CMOS, and thus radio frequency module 1 can be manufactured at low cost. On the other hand, amplifying elements 11B and 12B that receive input of high-power radio frequency signals and output high-power radio frequency signals are each made of a GaAs-based material, and thus can output radio frequency signals having high-quality amplification characteristics and high-quality noise characteristics.

Furthermore, amplifying elements 11A and 12A that do not require power handling may be formed, using a CMOS, into one chip together with switches 51 to 55 and a controller that controls connection of switches 51 to 55 and amplification factors of transmission power amplifiers 11 and 12 and reception low noise amplifiers 21 and 22. Accordingly, radio frequency module 1 can be miniaturized.

Note that transmission power amplifiers 11 and 12 each include two amplifying elements that are cascaded in the present embodiment, but may include three or more amplifying elements that are cascaded. Thus, each of the first transmission power amplifier and the second transmission power amplifier may include three or more amplifying elements that are cascaded. In this case, out of the amplifying elements, an amplifying element disposed most downstream is a first amplifying element, and an amplifying element disposed upstream of the first amplifying element is a second amplifying element.

Reception low noise amplifier 21 is a first reception low noise amplifier that amplifies radio frequency signals of communication bands A and B while noise is kept low. Reception low noise amplifier 22 is a second reception low noise amplifier that amplifies radio frequency signals of communication bands C and D while noise is kept low. Reception low noise amplifiers 21 and 22 are low noise amplifiers, for example.

Transmission filter 61T is disposed on a transmission path that connects transmission power amplifier 11 and common terminal 100, and passes a radio frequency signal of a transmission band of communication band A included in a radio frequency signal amplified by transmission power amplifier 11. Transmission filter 62T is disposed on a transmission path that connects transmission power amplifier 11 and common terminal 100, and passes a radio frequency signal of a transmission band of communication band B included in a radio frequency signal amplified by transmission power amplifier 11. Transmission filter 63T is disposed on a transmission path that connects transmission power amplifier 12 and common terminal 100, and passes a radio frequency signal of a transmission band of communication band C included in a radio frequency signal amplified by transmission power amplifier 12. Transmission filter 64T is disposed on a transmission path that connects transmission power amplifier 12 and common terminal 100, and passes a radio frequency signal of a transmission band of communication band D included in a radio frequency signal amplified by transmission power amplifier 12. As used herein, a "transmission path" or "transmission signal path" means a transfer route that includes, for instance, a line through which a radio frequency transmission signal propagates, an electrode directly connected to the line, and a terminal directly connected to the line or the electrode. Further, a "reception path" means a transfer route that includes, for instance, a line through which a radio frequency reception signal propagates, an electrode directly connected to the line, and a terminal directly connected to the line or the electrode. In addition, a "transmission and reception path" means a transfer route that includes, for instance, a line through which a radio frequency transmission signal and a radio frequency reception signal propagate, an electrode directly connected to the line, and a terminal directly connected to the line or the electrode. Furthermore, as used herein the terms "circuit" or "circuitry" means one or more circuits, including discrete circuit(s) as well as circuit board(s) and combinations thereof.

Reception filter 61R is disposed on a reception path that connects reception low noise amplifier 21 and common terminal 100, and passes a radio frequency signal of a reception band of communication band A included in a radio frequency signal input through common terminal 100. Reception filter 62R is disposed on a reception path that connects reception low noise amplifier 21 and common terminal 100, and passes a radio frequency signal of a reception band of communication band B included in a radio frequency signal input through common terminal 100. Reception filter 63R is disposed on a reception path that connects reception low noise amplifier 22 and common terminal 100, and passes a radio frequency signal of a reception band of communication band C included in a radio frequency signal input through common terminal 100. Reception filter 64R is disposed on a reception path that connects reception low noise amplifier 22 and common terminal 100, and passes a radio frequency signal of a reception band of communication band D included in a radio frequency signal input through common terminal 100.

Note that transmission filters 61T to 64T and reception filters 61R to 64R may each be any of, for example, a surface acoustic wave filter, an acoustic wave filter that uses bulk acoustic waves (BAWs), an inductor-capacitor (LC) resonance filter, and a dielectric filter, and furthermore, are not limited to such filters.

Transmission filter 61T and reception filter 61R are included in duplexer 61 having a passband that is communication band A. Transmission filter 62T and reception filter 62R are included in duplexer 62 having a passband that is communication band B. Transmission filter 63T and reception filter 63R are included in duplexer 63 having a passband that is communication band C. Transmission filter 64T and reception filter 64R are included in duplexer 64 having a passband that is communication band D.

Transmission output matching circuit 30 includes matching circuits 31 and 32. Matching circuit 31 is disposed on transmission paths between transmission power amplifier 11 and transmission filters 61T and 62T, and matches the impedance between transmission power amplifier 11 and transmission filter 61T and the impedance between transmission power amplifier 11 and transmission filter 62T. Matching circuit 32 is disposed on transmission paths between transmission power amplifier 12 and transmission filters 63T and 64T, and matches the impedance between transmission power amplifier 12 and transmission filter 63T and the impedance between transmission power amplifier 12 and transmission filter 64T.

Reception input matching circuit 40 includes matching circuits 41 and 42. Matching circuit 41 is disposed on reception paths between reception low noise amplifier 21 and reception filters 61R and 62R, and matches the impedance between reception low noise amplifier 21 and reception filter 61R and the impedance between reception low noise amplifier 21 and reception filter 62R. Matching circuit 42 is disposed on reception paths between reception low noise amplifier 22 and reception filters 63R and 64R, and matches the impedance between reception low noise amplifier 22 and reception filter 63R and the impedance between reception low noise amplifier 22 and reception filter 64R.

Switch 51 is a first switch that is disposed on transmission paths that connect matching circuit 31 and transmission filters 61T and 62T, and switches between conduction and non-conduction between common terminal 100 and transmission power amplifier 11. More specifically, switch 51 switches connection of transmission power amplifier 11 between transmission filter 61T and transmission filter 62T. Switch 51 includes a single pole double throw (SPDT) switch circuit that includes, for example, a common terminal connected to matching circuit 31, one selection terminal connected to transmission filter 61T, and another selection terminal connected to transmission filter 62T.

Switch 52 is a first switch that is disposed on transmission paths that connect matching circuit 32 and transmission filters 63T and 64T, and switches between conduction and non-conduction between common terminal 100 and transmission power amplifier 12. More specifically, switch 52 switches connection of transmission power amplifier 12 between transmission filter 63T and transmission filter 64T. Switch 52 includes an SPDT switch circuit that includes, for example, a common terminal connected to matching circuit 32, one selection terminal connected to transmission filter 63T, and another selection terminal connected to transmission filter 64T.

Switch 53 is a second switch that is disposed on reception paths that connect matching circuit 41 and reception filters 61R and 62R, and switches between conduction and non-conduction between common terminal 100 and reception low noise amplifier 21. More specifically, switch 53 switches connection of reception low noise amplifier 21 between reception filter 61R and reception filter 62R. Switch 53 includes an SPDT switch circuit that includes, for example, a common terminal connected to matching circuit 41, one selection terminal connected to reception filter 61R, and another selection terminal connected to reception filter 62R.

Switch 54 is a second switch that is disposed on reception paths that connect matching circuit 42 and reception filters 63R and 64R, and switches between conduction and non-conduction between common terminal 100 and reception low noise amplifier 22. More specifically, switch 54 switches connection of reception low noise amplifier 22 between reception filter 63R and reception filter 64R. Switch 54 includes an SPDT switch circuit that includes, for example, a common terminal connected to matching circuit 42, one selection terminal connected to reception filter 63R, and another selection terminal connected to reception filter 64R.

Switch 55 is disposed on signal paths that connect common terminal 100 to transmission filters 61T to 64T and reception filters 61R to 64R, is a first switch that switches between conduction and non-conduction between common terminal 100 and transmission power amplifier 11, and is a second switch that switches between conduction and non-conduction between common terminal 100 and reception low noise amplifier 21. More specifically, switch 55 switches among (1) connection between common terminal 100 and duplexer 61, (2) connection between common terminal 100 and duplexer 62, (3) connection between common terminal 100 and duplexer 63, and (4) connection between common terminal 100 and duplexer 64. Note that switch 55 may include a switch circuit that makes only one of connections (1) to (4) above or may include a multi-connection switch circuit that can simultaneously make two or more of connections (1) to (4) above.

Matching circuit 71 is disposed on a path that connects switch 55 to transmission filter 61T and reception filter 61R, and matches the impedance between (i) transmission filter 61T and (ii) antenna 2 and switch 55, and the impedance between (i) reception filter 61R and (ii) antenna 2 and switch 55. Matching circuit 72 is disposed on a path that connects switch 55 to transmission filter 62T and reception filter 62R, and matches the impedance between (i) transmission filter 62T and (ii) antenna 2 and switch 55, and the impedance between (i) reception filter 62R and (ii) antenna 2 and switch 55. Matching circuit 73 is disposed on a path that connects switch 55 to transmission filter 63T and reception filter 63R, and matches the impedance between (i) transmission filter 63T and (ii) antenna 2 and switch 55, and the impedance between (i) reception filter 63R and (ii) antenna 2 and switch 55. Matching circuit 74 is disposed on a path that connects switch 55 to transmission filter 64T and reception filter 64R, and matches the impedance between (i) transmission filter 64T and (ii) antenna 2 and switch 55, and the impedance between (i) reception filter 64R and (ii) antenna 2 and switch 55.

Note that it is sufficient if the radio frequency module according to the present disclosure amplifies radio frequency signals of the first frequency band group and outputs the amplified radio frequency signals, so that transmission power amplifier 11 and reception low noise amplifier 21 are essential for the radio frequency module. Thus, the radio frequency module according to the present disclosure does not necessarily include common terminal 100, transmission input terminal 110, reception output terminal 130, transmission output matching circuit 30, reception input matching circuit 40, transmission filters 61T to 64T, reception filters 61R to 64R, switches 51 to 55, or matching circuits 71 to 74. Thus, the radio frequency module may be a system that transmits and receives radio frequency signals of a single communication band, rather than simultaneously transmitting, simultaneously receiving, or simultaneously transmitting and receiving radio frequency signals of two or more communication bands.

In the above configuration of radio frequency module 1, transmission power amplifier 11, matching circuit 31, switch 51, and transmission filters 61T and 62T are included in a first transmission circuit that outputs radio frequency signals of communication band A and communication band B toward common terminal 100. Transmission power amplifier 12, matching circuit 32, switch 52, and transmission filters 63T and 64T are included in a second transmission circuit that outputs radio frequency signals of communication band C and communication band D toward common terminal 100. The first transmission circuit and the second transmission circuit are included in a transmission circuit that outputs radio frequency signals of communication bands A to D toward common terminal 100.

Reception low noise amplifier 21, matching circuit 41, switch 53, and reception filters 61R and 62R are included in a first reception circuit that receives input of radio frequency signals of communication band A and communication band B from antenna 2 through common terminal 100. Reception low noise amplifier 22, matching circuit 42, switch 54, and reception filters 63R and 64R are included in a second reception circuit that receives input of radio frequency signals of communication band C and communication band D from antenna 2 through common terminal 100. The first reception circuit and the second reception circuit are included in a reception circuit that receives input of radio frequency signals of communication bands A to D through common terminal 100.

According to the circuit configuration, radio frequency module 1 according to the present embodiment can carry out at least one of simultaneous transmission, simultaneous reception, or simultaneous transmission and reception of a radio frequency signal of communication band A or communication band B and a radio frequency signal of communication band C or communication band D.

Here, when radio frequency module 1 that includes circuit elements as described above is achieved by one module as a compact front-end circuit, downstream amplifying elements 11B and 12B that output high power are assumed to be adjacent to reception low noise amplifiers 21 and 22. In this case, if harmonics of high-power radio frequency signals output from amplifying elements 11B and 12B and/or intermodulation distortion resulting from the radio frequency signals and other radio frequency signals flow(s) into reception low noise amplifier 21, reception sensitivity of the reception path on which reception low noise amplifier 21 is disposed deteriorates. An example of such a case is when the reception band of communication band C or D includes at least one of frequencies of harmonics of a radio frequency signal amplified by amplifying element 11B. Another example of such a case is when the reception band of one of communication bands A to D includes at least one of frequencies of intermodulation distortion resulting from a radio frequency signal amplified by amplifying element 11B and another radio frequency signal.

To address this, radio frequency module 1 according to the present embodiment has a configuration in which a radio frequency signal output from most downstream amplifying element 11B in transmission power amplifier 11 can be prevented from flowing into reception low noise amplifier 21. Radio frequency module 1 also has a configuration in which a radio frequency signal output from most downstream amplifying element 12B in transmission power amplifier 12 can be prevented from flowing into reception low noise amplifier 22. The following describes a configuration of radio frequency module 1 according to the present embodiment for preventing radio frequency signals output from the most downstream amplifying elements from flowing into the reception low noise amplifiers.

[1.2 Arrangement of Circuit Elements of Radio Frequency Module 1]

Figure 2A:
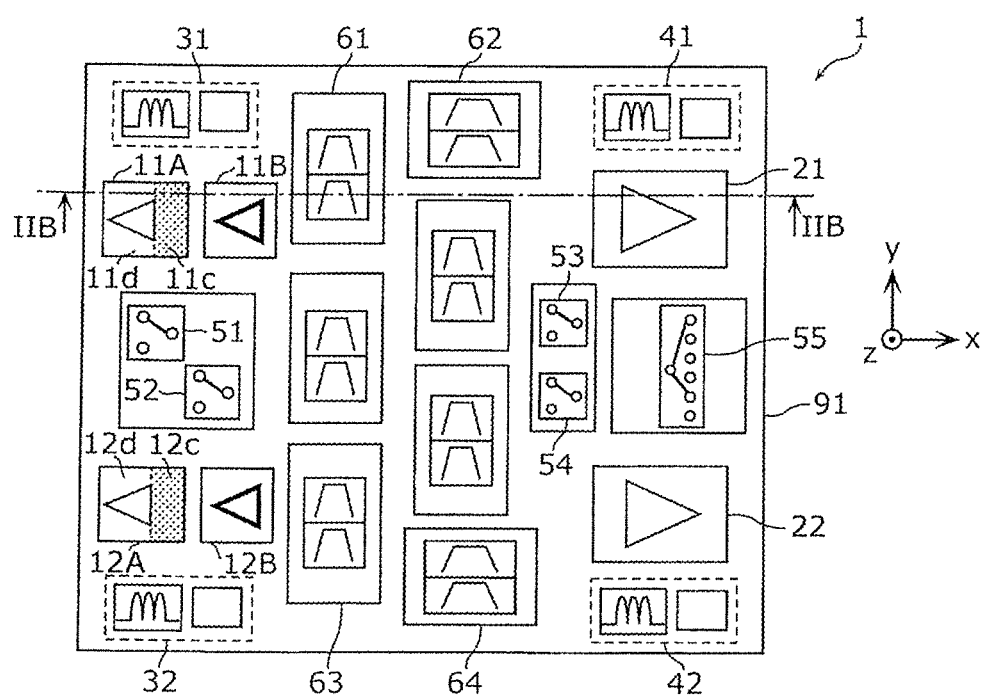
FIG. 2A is a schematic diagram illustrating a planar configuration of a radio frequency module (or RF front-end circuitry) according to Embodiment 1.
Figure 2B:
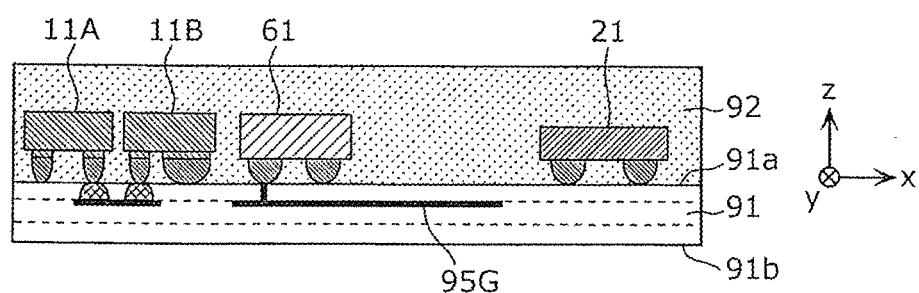
FIG. 2B is a schematic diagram illustrating a cross-sectional configuration of the radio frequency module according to Embodiment 1.

FIG. 2A is a schematic diagram illustrating a planar configuration of radio frequency module 1 according to Embodiment 1. FIG. 2B is a schematic diagram illustrating a cross-sectional configuration of radio frequency module 1 according to Embodiment 1, and specifically, illustrates a cross section taken along line IIB to IIB in FIG. 2A.

As illustrated in FIGS. 2A and 2B, radio frequency module 1 according to the present embodiment further includes module board 91 and resin member 92, in addition to the circuit configuration illustrated in FIG. 1.

Module board 91 is a board that includes principal surface 91a (a first principal surface) and principal surface 91b (a second principal surface) on opposite sides of module board 91, and on which the transmission circuit and the reception circuit described above are mounted. As module board 91, one of a low temperature co-fired ceramics (LTCC) board and a printed circuit board each having, for example, a stacked structure of a plurality of dielectric layers is used.

Resin member 92 is disposed on principal surface 91a of module board 91, and covers the transmission circuit, the reception circuit, and principal surface 91a of module board 91, and has a function of ensuring reliability of mechanical strength and moisture resistance, for instance, of circuit elements included in the transmission circuit and the reception circuit. Note that resin member 92 is not an essential element for the radio frequency module according to the present disclosure.

As illustrated in FIGS. 2A and 2B, in radio frequency module 1 according to the present embodiment, transmission power amplifier 11 (11A and 11B), transmission power amplifier 12 (12A and 12B), reception low noise amplifiers 21 and 22, duplexers 61 to 64, matching circuits 31, 32, 41, and 42, and switches 51 to 55 are mounted on principal surface 91a of module board 91. Note that although not illustrated in FIGS. 2A and 2B, matching circuits 71 to 74 may be mounted on either of principal surfaces 91a and 91b of module board 91 or may be provided inside of module board 91.

Amplifying elements 11A and 11B of transmission power amplifier 11 are mounted on principal surface 91a of module board 91. Amplifying elements 12A and 12B of transmission power amplifier 12 are mounted on principal surface 91a of module board 91.

Amplifying element 11A includes drive control circuit 11c and drive amplifying element 11d. Drive control circuit 11c generates and controls a bias voltage (current) supplied to amplifying element 11B and drive amplifying element 11d. Drive amplifying element 11d is an amplification transistor of amplifying element 11A.

Amplifying element 12A includes drive control circuit 12c and drive amplifying element 12d. Drive control circuit 12c generates and controls a bias voltage (current) supplied to amplifying element 12B and drive amplifying element 12d. Drive amplifying element 12d is an amplification transistor of amplifying element 12A.

Matching circuits 31, 32, 41, and 42 each include at least one of an inductor or a capacitor.

Here, in radio frequency module 1 according to the present embodiment, a conductive member mounted on principal surface 91a is located between (i) most downstream amplifying elements 11B and 12B and (ii) reception low noise amplifiers 21 and 22, in a plan view of module board 91 (when viewed in the z-axis direction). Here, the conductive member is an electronic member that includes a conductive member such as a signal extraction electrode, and is, for example, at least one element out of passive elements such as a resistor, a capacitor, an inductor, a filter, a switch, a signal line, and a signal terminal and active elements such as an amplifier and a control circuit. In the present embodiment, the conductive member is at least one duplexer out of duplexers 61 to 64. Furthermore, the conductive member may be at least one filter out of the transmission filters and the reception filters included in duplexers 61 to 64. The transmission filters and the reception filters included in duplexers 61 to 64 each include conductive members such as signal extraction electrodes and, for example, at least one of the signal extraction electrodes is connected to ground pattern 95G provided in module board 91.

According to the above configuration, amplifying elements 11B and 12B that output high-power radio frequency signals and reception low noise amplifiers 21 and 22 are disposed on principal surface 91a of module board 91, yet at least one of duplexers 61 to 64 mounted on principal surface 91a is located between (i) most downstream amplifying elements 11B and 12B and (ii) reception low noise amplifiers 21 and 22. Accordingly, high-power radio frequency signals generated by amplifying elements 11B and 12B and harmonics thereof can be prevented from flowing into reception low noise amplifiers 21 and 22. Accordingly, the inflow of harmonic components of high-power radio frequency signals amplified by amplifying elements 11B and 12B into the reception circuit and/or the inflow of intermodulation distortion components resulting from the radio frequency signals and other radio frequency signals into the reception circuit can be decreased, and thus deterioration of reception sensitivity of radio frequency module 1 can be reduced.

Note that the state in which a conductive member mounted on principal surface 91a is located between (i) amplifying elements 11B and 12B and (ii) reception low noise amplifiers 21 and 22 in a plan view of module board 91 may satisfy, in the plan view, at least one of (1) a state in which the region occupied by the conductive member projected in the plan view at least partially overlaps a line that connects an arbitrary point in the region occupied by amplifying element 11B projected in the plan view and an arbitrary point in the region occupied by reception low noise amplifier 21 projected in the plan view, (2) a state in which the region occupied by the conductive member projected in the plan view at least partially overlaps a line that connects an arbitrary point in the region occupied by amplifying element 12B projected in the plan view and an arbitrary point in the region occupied by reception low noise amplifier 21 projected in the plan view, (3) a state in which the region occupied by the conductive member projected in the plan view at least partially overlaps a line that connects an arbitrary point in the region occupied by amplifying element 11B projected in the plan view and an arbitrary point in the region occupied by reception low noise amplifier 22 projected in the plan view, or (4) a state in which the region occupied by the conductive member projected in the plan view at least partially overlaps a line that connects an arbitrary point in the region occupied by amplifying element 12B projected in the plan view and an arbitrary point in the region occupied by reception low noise amplifier 22 projected in the plan view.

Thus, radio frequency module 1 according to the present embodiment has a configuration in which the conductive member mounted on principal surface 91a is located between (i) amplifying elements 11B and 12B and (ii) reception low noise amplifiers 21 and 22, yet it is sufficient if the conductive member mounted on principal surface 91a is located between at least one of amplifying element 11B or 12B and at least one of reception low noise amplifier 21 or 22.

Accordingly, the inflow of a harmonic component of a high-power radio frequency signal transferred through a transmission path into a reception path and/or the inflow of an intermodulation distortion component resulting from the radio frequency signal and another radio frequency signal into a reception path can be decreased, and thus deterioration of reception sensitivity of the reception paths can be reduced. Consequently, deterioration of reception sensitivity of radio frequency module 1 can be reduced.

Note that the present embodiment has shown a transmission filter and a reception filter as examples of the conductive member disposed between (i) amplifying elements 11B and 12B and (ii) reception low noise amplifiers 21 and 22, yet other than a transmission filter and a reception filter, the conductive member may be one of (1) switch 55, (2) switch 51 or 52, (3) switch 53 or 54, (4) a diplexer (multiplexer) disposed between common terminal 100 and a transmission filter and between common terminal 100 and a reception filter, (5) a chip capacitor, and (6) a control circuit that generates at least one of a control signal for adjusting gains of transmission power amplifiers 11 and 12 and reception low noise amplifiers 21 and 22 or a control signal for controlling switching of switches 51 to 55.

Note that the control circuit in (6) above may be a switch IC that includes at least one of switches 51 to 55.

Note that the circuit elements in (1) to (6) above each desirably include an electrode set to the earth potential or a fixed potential, and are desirably connected to the ground pattern formed inside of module board 91, for example. Accordingly, the electromagnetic-field shielding function of the circuit elements in (1) to (6) above improves.

According to the examples of the conductive member shown above, the electromagnetic fields generated from amplifying elements 11B and 12B can be shielded, and thus high-power radio frequency signals generated by amplifying elements 11B and 12B and harmonics thereof can be prevented from flowing into reception low noise amplifiers 21 and 22. Accordingly, the inflow of harmonic components of high-power radio frequency signals amplified by amplifying elements 11B and 12B into the reception circuit and/or the inflow of intermodulation distortion components resulting from the radio frequency signals and other radio frequency signals into the reception circuit can be decreased, and thus deterioration of reception sensitivity of radio frequency module 1 can be reduced.

[1.3 Arrangement of Circuit Elements of Radio Frequency Module 1A According to Variation]

Figure 3:
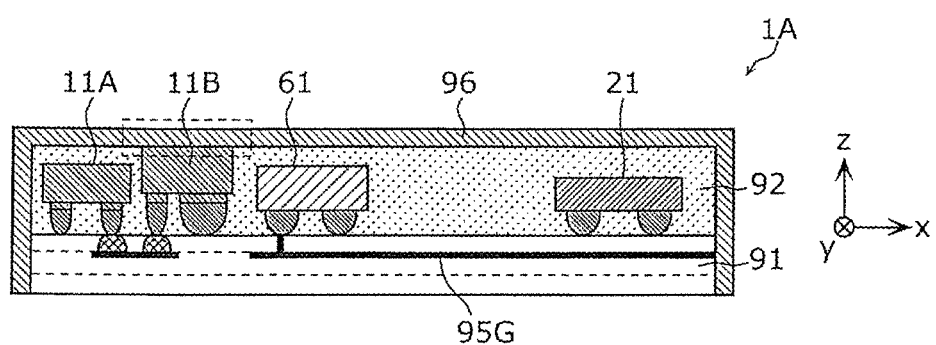
FIG. 3 is a schematic diagram illustrating a cross-sectional configuration of a radio frequency module according to a variation of Embodiment 1.

FIG. 3 is a schematic diagram illustrating a cross-sectional configuration of radio frequency module 1A according to a variation of Embodiment 1. Radio frequency module 1A according to this variation is different from radio frequency module 1 according to Embodiment 1 in that shielding-electrode layer 96 is additionally provided. The following description of radio frequency module 1A according to this variation focuses on differences from radio frequency module 1 according to Embodiment 1 while a description of the same points is omitted.

Shielding-electrode layer 96 is formed so as to cover top and side surfaces of resin member 92, and is connected to ground pattern 95G set to the ground potential and provided in module board 91, on a side surface of module board 91. The top surfaces of high-power amplifying elements 11B and 12B are in contact with shielding-electrode layer 96. Since shielding-electrode layer 96 is provided, radio frequency signals output from transmission power amplifiers 11 and 12 can be prevented from being directly radiated from radio frequency module 1A to the outside, and extraneous noise can be prevented from sneaking into circuit elements included in radio frequency module 1A. Furthermore, heat generated by amplifying elements 11B and 12B can be dissipated through shielding-electrode layer 96, and thus heat dissipation properties improve.

[1.4 Spaced Arrangement of Most Downstream Amplifying Element and Reception Low Noise Amplifier]

Note that radio frequency module 1 according to the present embodiment includes a conductive member mounted on module board 91 between (i) amplifying elements 11B and 12B and (ii) reception low noise amplifiers 21 and 22, but may instead have a configuration as follows.

Figure 4:
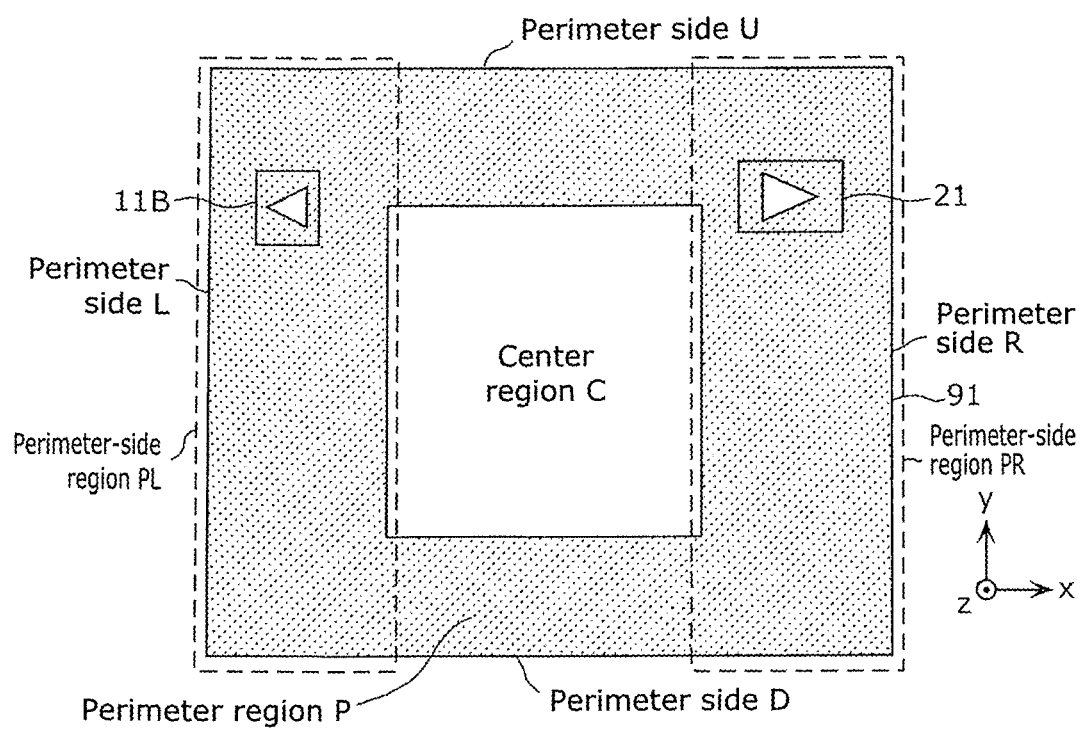
FIG. 4 is a diagram illustrating spaced arrangement of an amplifying element and a reception low noise amplifier according to Embodiment 1.

FIG. 4 is a diagram illustrating spaced arrangement of amplifying elements 11B and 12B and reception low noise amplifiers 21 and 22 according to Embodiment 1. FIG. 4 illustrates only amplifying element 11B and reception low noise amplifier 21, out of the circuit elements mounted on principal surface 91a (illustrated in FIG. 2B) of module board 91.

In a plan view of principal surface 91a, principal surface 91a has a quadrilateral shape, and includes center region C that includes at least one filter out of transmission filters 61T to 64T and reception filters 61R to 64R, and perimeter region P other than center region C. Furthermore, perimeter region P includes four perimeter-side regions PU, PD, and PL and PR that include four perimeter sides U, D, L, and R of principal surface 91a. Here, in a plan view of principal surface 91a, at least one of amplifying element 11B or 12B and at least one of reception low noise amplifier 21 or 22 are disposed in two perimeter-side regions PL and PR facing each other across center region C or in two perimeter-side regions PU and PD facing each other across center region C.

According to the above configuration, amplifying elements 11B and 12B and reception low noise amplifiers 21 and 22 are separately disposed on principal surface 91a of module board 91, in perimeter-side regions facing across center region C that includes at least one filter out of the transmission filters and the reception filters. Accordingly, amplifying elements 11B and 12B and reception low noise amplifiers 21 and 22 are disposed on principal surface 91a of module board 91, but are spaced apart from one another, and thus high-power radio frequency signals generated by amplifying elements 11B and 12B and harmonics thereof can be prevented from flowing into reception low noise amplifiers 21 and 22. Thus, the inflow of harmonic components of high-power radio frequency signals amplified by transmission power amplifiers 11 and 12 into the reception circuit and/or the inflow of intermodulation distortion components resulting from the radio frequency signals and other radio frequency signals into the reception circuit can be decreased, and thus deterioration of reception sensitivity of radio frequency module 1 can be reduced.

[1.5 Summary of Embodiment 1]

As described above, radio frequency module 1 according to the present embodiment includes: transmission power amplifier 11 that includes a plurality of amplifying elements that are cascaded; reception low noise amplifier 21; and module board 91 on which transmission power amplifier 11 and reception low noise amplifier 21 are mounted. The plurality of amplifying elements include amplifying element 11B (a first amplifying element) disposed most downstream of the plurality of amplifying elements; and amplifying element 11A (a second amplifying element) disposed upstream of amplifying element 11B. Here, in a plan view of module board 91, a conductive member mounted on principal surface 91a is located between amplifying element 11B and reception low noise amplifier 21.

Accordingly, a high-power radio frequency signal generated by amplifying element 11B and harmonics thereof can be prevented from flowing into reception low noise amplifier 21. Thus, the inflow of a harmonic component of a high-power radio frequency signal amplified by amplifying element 11B into the reception circuit and/or the inflow of an intermodulation distortion component resulting from the radio frequency signal and another radio frequency signal into the reception circuit can be decreased, and thus fall of the reception sensitivity of radio frequency module 1 can be reduced.

The conductive member may be amplifying element 11A. Accordingly, the inflow of harmonic components of high-power radio frequency signals amplified by amplifying elements 11B and 12B into the reception circuit and/or the inflow of intermodulation distortion components resulting from the radio frequency signals and other radio frequency signals into the reception circuit can be decreased, and thus fall of the reception sensitivity of radio frequency module 1 can be reduced.

Radio frequency module 1 according to the present embodiment includes: common terminal 100; transmission input terminal 110 (a first transmission input terminal); transmission input terminal 120 (a second transmission input terminal); reception output terminal 130 (a second reception output terminal); reception output terminal 140 (a first reception output terminal); transmission power amplifier 11 (a first transmission power amplifier) that amplifies a radio frequency signal input through transmission input terminal 110, and outputs the amplified radio frequency signal to common terminal 100; transmission power amplifier 12 (a second transmission power amplifier) that amplifies a radio frequency signal input through transmission input terminal 120, and outputs the amplified radio frequency signal to common terminal 100; reception low noise amplifier 21 (a second reception low noise amplifier) that amplifies a radio frequency signal input through common terminal 100, and outputs the amplified radio frequency signal to reception output terminal 130; reception low noise amplifier 22 (a first reception low noise amplifier) that amplifies a radio frequency signal input through common terminal 100, and outputs the amplified radio frequency signal to reception output terminal 140; and module board 91 that includes principal surfaces 91a and 91b on opposite sides of module board 91, and on which transmission power amplifiers 11 and 12 and reception low noise amplifiers 21 and 22 are mounted. Transmission power amplifier 11 amplifies a radio frequency signal of the transmission band of communication band A, transmission power amplifier 12 amplifies a radio frequency signal of the transmission band of communication band C, reception low noise amplifier 21 amplifies a radio frequency signal of the reception band of communication band A, and reception low noise amplifier 22 amplifies a radio frequency signal of the reception band of communication band C. Transmission power amplifier 11 includes amplifier input terminal 111, amplifier output terminal 112, and a plurality of amplifying elements that are cascaded between amplifier input terminal 111 and amplifier output terminal 112. The plurality of amplifying elements include amplifying element 11B (a first amplifying element) mounted on principal surface 91a and disposed most downstream of the plurality of amplifying elements, and amplifying element 11A (a second amplifying element) mounted on principal surface 91a or 91b and disposed upstream of amplifying element 11B. Transmission power amplifier 12 includes amplifier input terminal 121, amplifier output terminal 122, and a plurality of amplifying elements that are cascaded between amplifier input terminal 121 and amplifier output terminal 122. The plurality of amplifying elements include amplifying element 12B (a first amplifying element) mounted on principal surface 91a and disposed most downstream of the amplifying elements, and amplifying element 12A (a second amplifying elements) mounted on principal surface 91a or 91b and disposed upstream of amplifying element 12B. Here, in a plan view of module board 91, a conductive member mounted on principal surface 91a is located between (i) amplifying elements 11B and 12B and (ii) reception low noise amplifiers 21 and 22.

Accordingly, high-power radio frequency signals generated by amplifying elements 11B and 12B and harmonics thereof can be prevented from flowing into reception low noise amplifiers 21 and 22. Thus, the inflow of harmonic components of high-power radio frequency signals amplified by amplifying elements 11B and 12B into the reception circuit and/or the inflow of intermodulation distortion components of the radio frequency signals and other radio frequency signals into the reception circuit can be decreased, and thus the fall of reception sensitivity of radio frequency module 1 can be reduced.

Radio frequency module 1 according to the present embodiment includes transmission power amplifier 11 that includes a plurality of amplifying elements that are cascaded; reception low noise amplifier 21; transmission filter 61T that is disposed on a transmission path that includes transmission power amplifier 11, and passes a radio frequency signal of a predetermined transmission band included in a radio frequency signal amplified by transmission power amplifier 11; reception filter 61R that is disposed on a reception path that includes reception low noise amplifier 21, and passes a radio frequency signal of a predetermined reception band included in an input radio frequency signal; and module board 91 that includes principal surfaces 91a and 91b each having a quadrilateral shape on opposite sides of module board 91, and on which transmission power amplifier 11 and reception low noise amplifier 21 are mounted. The plurality of amplifying elements include amplifying element 11B (a first amplifying element) disposed most downstream of the amplifying elements, and amplifying element 11A (a second amplifying element) disposed upstream of amplifying element 11B. Here, in a plan view of module board 91, module board 91 includes center region C that includes at least one of transmission filter 61T or reception filter 61R, and four perimeter-side regions PU, PD, PL, and PR that include four perimeter sides U, D, L, and R of module board 91, other than center region C.

In the plan view of module board 91, amplifying element 11B and reception low noise amplifier 21 are disposed in two perimeter-side regions PL and PR (or PU and PD) facing each other across center region C.

Accordingly, amplifying element 11B and reception low noise amplifier 21 are disposed on the same principal surface of module board 91, but are spaced apart from each other, and thus a high-power radio frequency signal generated by amplifying element 11B and harmonics thereof can be prevented from flowing into reception low noise amplifier 21. Consequently, the inflow of a harmonic component of a high-power radio frequency signal amplified by transmission power amplifier 11 into the reception circuit and/or the inflow of an intermodulation distortion component of the radio frequency signal and another radio frequency signal into the reception circuit can be decreased, and thus deterioration of reception sensitivity of radio frequency module 1 can be reduced.

Embodiment 2

Embodiment 1 has described a so-called single-sided mounting configuration in which the circuit elements included in the radio frequency module are mounted on principal surface 91a of module board 91, yet the present embodiment is to describe a so-called double-sided mounting configuration in which the circuit elements are mounted on principal surfaces 91a and 91b of module board 91. Note that the circuit configuration of radio frequency module 1B according to the present embodiment is the same as the circuit configuration of radio frequency module 1 according to Embodiment 1 illustrated in FIG. 1, and thus a description of the circuit configuration is omitted.

[2.1 Arrangement of Circuit Elements of Radio Frequency Module 1B]

Figure 5A:
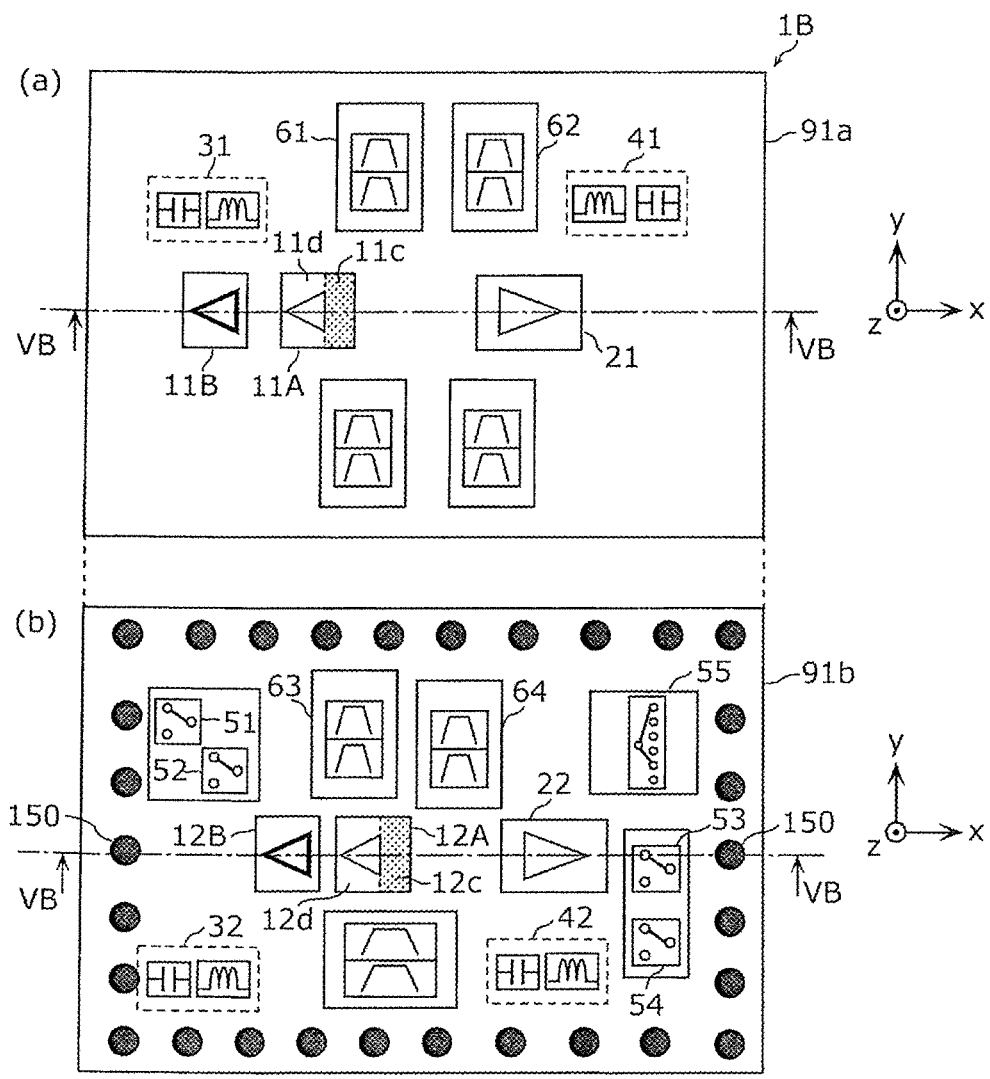
FIG. 5A illustrates schematic diagrams each showing a planar configuration of a radio frequency module according to Embodiment 2.
Figure 5B:
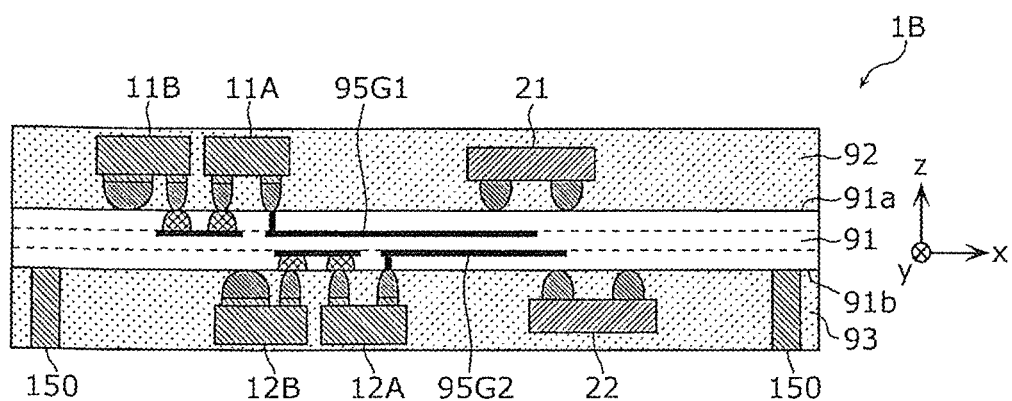
FIG. 5B is a schematic diagram illustrating a cross-sectional configuration of the radio frequency module according to Embodiment 2.

FIG. 5A illustrates schematic diagrams each showing a planar configuration of radio frequency module 1B according to Embodiment 2. FIG. 5B is a schematic diagram illustrating a cross-sectional configuration of radio frequency module 1B according to Embodiment 2, and specifically, illustrates a cross section taken along line VB to VB in FIG. 5A. Note that (a) of FIG. 5A illustrates the arrangement of circuit elements when principal surface 91a is viewed from the positive z-axis, out of principal surfaces 91a and 91b on opposite sides of module board 91. On the other hand, (b) of FIG. 5A is a perspective view of a layout of circuit elements when principal surface 91b is viewed from the positive z-axis.

As illustrated in FIGS. 5A and 5B, radio frequency module 1B according to the present embodiment further includes module board 91 and resin members 92 and 93, in addition to the circuit configuration illustrated in FIG. 1. Radio frequency module 1B according to the present embodiment is different from radio frequency module 1 according to Embodiment 1, in that the circuit elements included in radio frequency module 1B are mounted on the two sides of module board 91. The following description of radio frequency module 1B according to the present embodiment focuses on differences from radio frequency module 1 according to Embodiment 1 while a description of the same points is omitted.

As illustrated in FIGS. 5A and 5B, amplification terminals 11A and 11B of transmission power amplifier 11, duplexers 61 and 62, matching circuits 31 and 41, and reception low noise amplifier 21 are mounted on principal surface 91a of module board 91 in radio frequency module 1B according to the present embodiment. On the other hand, amplification terminals 12A and 12B of transmission power amplifier 12, duplexers 63 and 64, matching circuits 32 and 42, switches 51 to 55, and reception low noise amplifier 22 are mounted on principal surface 91b of module board 91. Stated differently, a first transmission circuit and a first reception circuit that transmit and receive radio frequency signals of the first frequency band group are mounted on principal surface 91a, and a second transmission circuit and a second reception circuit that transmit and receive radio frequency signals of the second frequency band group are mounted on principal surface 91b. Accordingly, when a radio frequency signal of the first frequency band group and a radio frequency signal of the second frequency band group are transferred by carrier aggregation (CA), isolation between the two radio frequency signals can be improved. Note that switches 51 to 55 may be included in a switch IC formed into one chip, and thus may be collectively mounted on one of principal surfaces 91a and 91b.

Here, radio frequency module 1B according to the present embodiment includes amplifying element 11A between amplifying element 11B and reception low noise amplifier 21, in a plan view of module board 91 (when module board 91 is viewed in the z-axis direction). Amplifying element 11A is a conductive member mounted on principal surface 91a. In a plan view of module board 91, radio frequency module 1B includes amplifying element 12A between amplifying element 12B and reception low noise amplifier 22. Amplifying element 12A is a conductive member mounted on principal surface 91b. Amplifying element 11A includes a plurality of conductive members such as signal extraction electrodes and, for example, at least one of the signal extraction electrodes is connected to ground pattern 95G1 provided in module board 91 as illustrated in FIG. 5B. Amplifying element 12A includes a plurality of conductive members such as signal extraction electrodes and, for example, at least one of the signal extraction electrodes is connected to ground pattern 95G2 provided in module board 91 as illustrated in FIG. 5B.

According to the above configuration, amplifying element 11B that outputs a high-power radio frequency signal and reception low noise amplifier 21 are disposed on principal surface 91a of module board 91, yet amplifying element 11A mounted on principal surface 91a is located between most downstream amplifying element 11B and reception low noise amplifier 21. Amplifying element 12B that outputs a high-power radio frequency signal and reception low noise amplifier 22 are disposed on principal surface 91b of module board 91, yet amplifying element 12A mounted on principal surface 91b is located between most downstream amplifying element 12B and reception low noise amplifier 22. Accordingly, high-power radio frequency signals generated by amplifying elements 11B and 12B and harmonics thereof can be prevented from flowing into reception low noise amplifiers 21 and 22. Consequently, the inflow of harmonic components of high-power radio frequency signals amplified by amplifying elements 11B and 12B into the reception circuit and/or the inflow of intermodulation distortion components resulting from the radio frequency signals and other radio frequency signals into the reception circuit can be decreased, and thus deterioration of reception sensitivity of radio frequency module 1 can be reduced.

As illustrated in FIG. 5A, drive control circuit 11c may be disposed apart from amplifying element 11B, out of drive control circuit 11c and drive amplifying element 11d included in amplifying element 11A. Further, drive control circuit 12c may be disposed apart from amplifying element 12B, out of drive control circuit 12c and drive amplifying element 12d included in amplifying element 12A. Accordingly, high-power radio frequency signals generated by amplifying elements 11B and 12B and harmonics thereof can be prevented from flowing into drive control circuits 11c and 12c. Thus, amplification characteristics of transmission power amplifiers 11 and 12 can be prevented from deteriorating due to the fall of control accuracy of drive control circuits 11c and 12c which prevents optimization of bias voltages applied to (currents flowing through) transmission power amplifiers 11 and 12.

In radio frequency module 1B according to the present embodiment, a plurality of columnar electrodes 150 are disposed on principal surface 91b of module board 91. Radio frequency module 1B exchanges, via columnar electrodes 150, electric signals with a motherboard disposed on the z-axis negative side of radio frequency module 1B. Some of columnar electrodes 150 are set to the ground potential of the motherboard. Switches 51 to 55 are mounted on principal surface 91b, yet switches 51 to 55 may be formed into one chip together with a control circuit that generates at least one of a control signal for adjusting the gains of transmission power amplifiers 11 and 12 and reception low noise amplifiers 21 and 22 or a control signal for controlling the switching of switches 51 to 55. Since columnar electrodes 150 are formed on principal surface 91b, malfunction of the control circuit due to noise can be prevented. Thus, deterioration of amplification characteristics of transmission power amplifiers 11 and 12 and reception low noise amplifiers 21 and 22 can be reduced.

Note that radio frequency module 1B according to the present embodiment has a configuration in which amplifying element 11A is disposed between amplifying element 11B and reception low noise amplifier 21, and amplifying element 12A is disposed between amplifying element 12B and reception low noise amplifier 22, yet it is sufficient if at least one of amplifying element 11A or 12A mounted on module board 91 may be disposed between at least one of amplifying element 11B or 12B and at least one of reception low noise amplifier 21 or 22. Accordingly, the inflow of a harmonic component of a high-power radio frequency signal transferred through a transmission path into a reception path and/or the inflow of an intermodulation distortion component resulting from the radio frequency signal and another radio frequency signal into a reception path can be decreased, and thus deterioration of reception sensitivity of the reception paths can be reduced. Consequently, deterioration of reception sensitivity of radio frequency module 1B can be reduced.

Note that radio frequency module 1B according to the present embodiment has a configuration in which amplifying elements 11A and 11B are both disposed on principal surface 91a, and amplifying elements 12A and 12B are both disposed on principal surface 91b, yet amplifying elements 11A and 11B may be mounted on different principal surfaces, and amplifying elements 12A and 12B may be mounted on different principal surfaces.

When amplifying elements 11A and 11B are both disposed on principal surface 91a, and amplifying elements 12A and 12B are both disposed on principal surface 91b, a line that connects amplifying elements 11A and 11B and a line that connects amplifying elements 12A and 12B can be made the shortest, and thus propagation loss caused by the lines can be reduced.

When amplifying elements 11A and 11B are disposed on different principal surfaces, and amplifying elements 12A and 12B are disposed on different principal surfaces, high-power radio frequency signals generated by amplifying elements 11B and 12B and harmonics thereof can be prevented from flowing into drive control circuits 11c and 12c since module board 91 is present between amplifying elements 11B and 12B. Accordingly, amplification characteristics of transmission power amplifiers 11 and 12 can be prevented from deteriorating due to the fall of control accuracy of drive control circuits 11c and 12c which prevents optimization of bias voltages applied to (currents flowing through) transmission power amplifiers 11 and 12.

Note that the radio frequency module according to the present disclosure may have a configuration in which the first transmission circuit and the first reception circuit that transmit and receive radio frequency signals of the first frequency band group are mounted on principal surface 91a, and the second transmission circuit and the second reception circuit that transmit and receive radio frequency signals of the second frequency band group are not mounted on principal surface 91b. Alternatively, the radio frequency module may have a configuration in which the first transmission circuit and the first reception circuit that transmit and receive radio frequency signals of the first frequency band group are not mounted on principal surface 91a, and the second transmission circuit and the second reception circuit that transmit and receive radio frequency signals of the second frequency band group are mounted on principal surface 91b.

[2.2 Arrangement of Circuit Elements of Radio Frequency Module 1C]

Figure 6A:
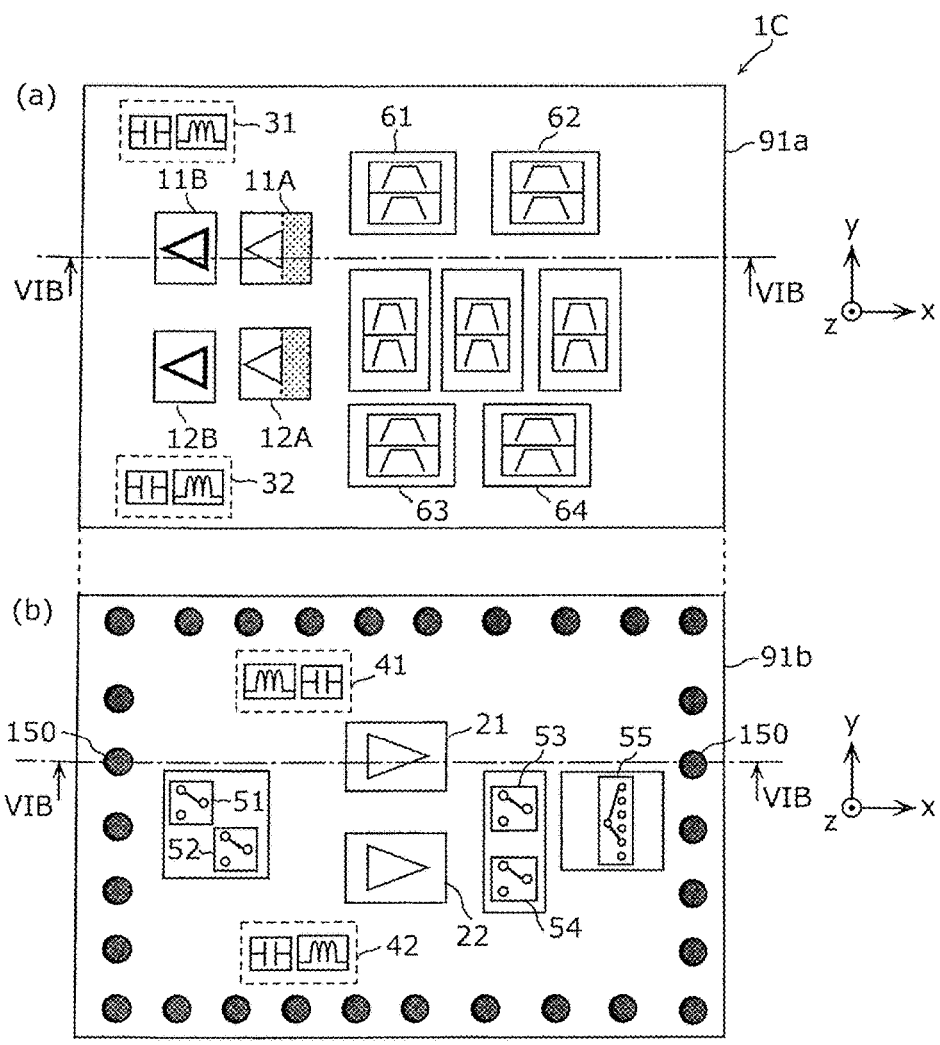
FIG. 6A illustrates schematic diagrams each showing a planar configuration of a radio frequency module according to a variation of Embodiment 2.
Figure 6B:
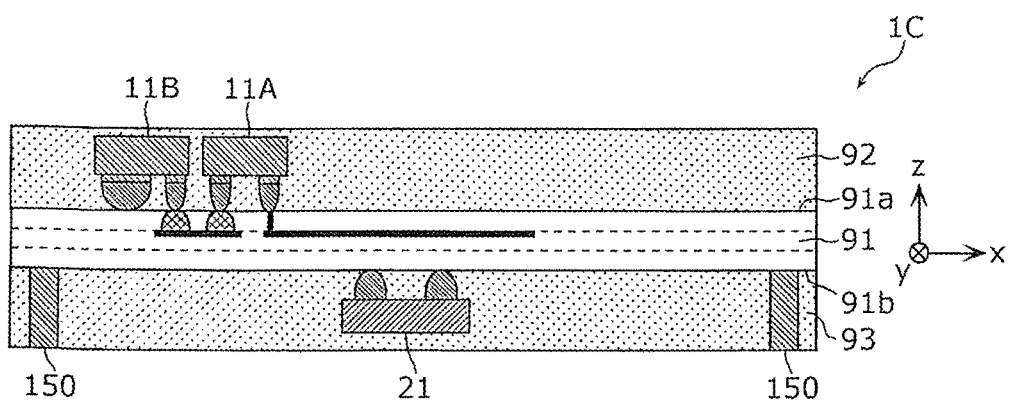
FIG. 6B is a schematic diagram illustrating a cross-sectional configuration of the radio frequency module according to the variation of Embodiment 2.

FIG. 6A illustrates schematic diagrams each showing a planar configuration of radio frequency module 1C according to a variation of Embodiment 2. FIG. 6B is a schematic diagram illustrating a cross-sectional configuration of radio frequency module 1C according to the variation of Embodiment 2, and specifically, illustrates a cross section taken along line VIB to VIB in FIG. 6A. Note that (a) of FIG. 6A illustrates a layout of circuit elements when principal surface 91a out of principal surfaces 91a and 91b on opposite sides of module board 91 is viewed from the positive z-axis. On the other hand, (b) of FIG. 6A is a perspective view of a layout of circuit elements when principal surface 91b is viewed from the positive z-axis.

As illustrated in FIGS. 6A and 6B, radio frequency module 1C according to this variation is different from radio frequency module 1B according to Embodiment 2, in how circuit elements included in radio frequency module 1C are separated and disposed on principal surfaces 91a and 91b. The following description of radio frequency module 1C according to this variation focuses on differences from radio frequency module 1B according to Embodiment 2 while a description of the same points is omitted.

As illustrated in FIGS. 6A and 6B, in radio frequency module 1C according to this variation, transmission power amplifier 11 (amplifying elements 11A and 11B), transmission power amplifier 12 (amplifying elements 12A and 12B), matching circuits 31 and 32, and duplexers 61 to 64 are mounted on principal surface 91a of module board 91. On the other hand, reception low noise amplifiers 21 and 22, matching circuits 41 and 42, and switches 51 to 55 are mounted on principal surface 91b of module board 91.

Thus, in radio frequency module 1C according to this variation, a transmission circuit that includes duplexers 61 to 64 is mounted on principal surface 91a. On the other hand, a reception circuit that includes switches 51 to 55 is mounted on principal surface 91b. Accordingly, isolation between a transmission path and a reception path can be improved.

Here, radio frequency module 1C according to the present embodiment includes amplifying elements 11A and 12A between (i) amplifying elements 11B and 12B and (ii) reception low noise amplifiers 21 and 22 in a plan view of module board 91 (when module board 91 is viewed in the z-axis direction). Amplifying elements 11A and 12A are conductive members mounted on principal surface 91a. Amplifying elements 11A and 12A each include a plurality of conductive members such as signal extraction electrodes and, for example, at least one of the signal extraction electrodes is connected to a ground pattern provided in module board 91.

According to the above configuration, in a plan view of module board 91, amplifying elements 11A and 12A mounted on principal surface 91a are located between (i) amplifying elements 11B and 12B that output high-power radio frequency signals and are disposed on principal surface 91a and (ii) reception low noise amplifiers 21 and 22 disposed on principal surface 91b. Furthermore, module board 91 is present between (i) amplifying elements 11B and 12B and (ii) reception low noise amplifiers 21 and 22. Consequently, high-power radio frequency signals generated by amplifying elements 11B and 12B and harmonics thereof can be prevented from flowing into reception low noise amplifiers 21 and 22. Thus, the inflow of harmonic components of high-power radio frequency signals amplified by amplifying elements 11B and 12B into the reception circuit and/or the inflow of intermodulation distortion components resulting from the radio frequency signals and other radio frequency signals into the reception circuit can be decreased, and thus deterioration of reception sensitivity of radio frequency module 1C can be reduced.

In radio frequency module 1C according to this variation, a plurality of columnar electrodes 150 are disposed on principal surface 91b of module board 91. Radio frequency module 1C exchanges, via columnar electrodes 150, electric signals with a motherboard disposed on the z-axis negative side of radio frequency module 1C. Some of columnar electrodes 150 are set to the ground potential of the motherboard. On principal surface 91b that faces the motherboard out of principal surfaces 91a and 91b, transmission power amplifiers 11 and 12 whose height is not readily decreased are not disposed, and reception low noise amplifiers 21 and 22 and switches 51 to 55 whose height is readily decreased are disposed, and thus the height of radio frequency module 1C as a whole can be decreased.

Note that radio frequency module 1C according to this variation has a configuration in which in a plan view of module board 91, amplifying element 11A is disposed between amplifying element 11B and reception low noise amplifier 21, and amplifying element 12A is disposed between amplifying element 12B and reception low noise amplifier 22, but it is sufficient if at least one of amplifying element 11A or 12A mounted on module board 91 is disposed between at least one of amplifying element 11B or 12B and at least one of reception low noise amplifier 21 or 22. Accordingly, the inflow of a harmonic component of a high-power radio frequency signal transferred through a transmission path into a reception path and/or the inflow of an intermodulation distortion component resulting from the radio frequency signal and another radio frequency signal into a reception path can be decreased, and thus deterioration of reception sensitivity of the reception paths can be reduced. Consequently, deterioration of reception sensitivity of radio frequency module 1C can be reduced.

Note that in the present embodiment and the variation thereof, amplifying elements 11A and 12A are described as examples of a conductive member disposed between (i) amplifying elements 11B and 12B and (ii) reception low noise amplifiers 21 and 22, but may each be one of (1) switch 55, (2) switch 51 or 52, (3) switch 53 or 54, (4) one of transmission filters 61T to 64T, (5) one of reception filters 61R to 64R, (6) a diplexer (multiplexer) disposed between common terminal 100 and a transmission filter and between common terminal 100 and a reception filter, (7) a chip capacitor, or (8) a control circuit that generates at least one of a control signal for adjusting the gains of transmission power amplifiers 11 and 12 and reception low noise amplifiers 21 and 22 or a control signal for controlling switching of switches 51 to 55.

Note that the control circuit in (8) above may be a switch IC that includes at least one switch out of switches 51 to 55.

Note that the circuit elements in (1) to (8) above each desirably include an electrode set to the earth potential or a fixed potential, and are desirably connected to a ground pattern formed inside of module board 91, for example. Accordingly, the electromagnetic-field shielding function of the circuit elements in (1) to (8) above improves.

According to the conductive members shown above as examples, the electromagnetic fields generated from amplifying elements 11B and 12B can be shielded, and thus high-power radio frequency signals generated by amplifying elements 11B and 12B and harmonics thereof can be prevented from flowing into reception low noise amplifiers 21 and 22. Consequently, the inflow of harmonic components of high-power radio frequency signals amplified by amplifying elements 11B and 12B into the reception circuit and/or the inflow of an intermodulation distortion components resulting from the radio frequency signals and other radio frequency signals into the reception circuit can be decreased, and thus deterioration of reception sensitivity of radio frequency modules 1B and 1C can be reduced.

Note that radio frequency module 1C according to the present embodiment has a configuration in which amplifying elements 11A and 11B are both disposed on principal surface 91a, and amplifying elements 12A and 12B are both disposed on principal surface 91a, yet amplifying elements 11A and 11B may be mounted on different principal surfaces, and amplifying elements 12A and 12B may be mounted on different principal surfaces.

When amplifying elements 11A and 11B are both disposed on principal surface 91a, and amplifying elements 12A and 12B are both disposed on principal surface 91a, a line that connects amplifying elements 11A and 11B, and a line that connects amplifying elements 12A and 12B can be made the shortest, and thus propagation loss caused by the lines can be reduced.

When amplifying elements 11A and 11B are disposed on different principal surfaces and amplifying elements 12A and 12B are disposed on different principal surfaces, high-power radio frequency signals generated by amplifying elements 11B and 12B and harmonics thereof can be prevented from flowing into drive control circuits 11c and 12c since module board 91 is present between amplifying elements 11B and 12B. Accordingly, amplification characteristics of transmission power amplifiers 11 and 12 can be prevented from deteriorating due to the fall of control accuracy of drive control circuits 11c and 12c which prevents optimization of bias voltages applied to (currents flowing through) transmission power amplifiers 11 and 12.

Note that the radio frequency module according to the present disclosure may have a configuration in which out of the first transmission circuit that transmits a radio frequency signal of the first frequency band group and the second transmission circuit that transmits a radio frequency signal of the second frequency band group, only the first transmission circuit is mounted on principal surface 91a, and out of the first reception circuit that receives a radio frequency signal of the first frequency band group and the second reception circuit that receives a radio frequency signal of the second frequency band group, only the first reception circuit is mounted on principal surface 91b.

[Other Embodiments etc.]

The above has described the radio frequency module and the communication device according to embodiments of the present disclosure, based on the embodiments and the variations thereof, yet the radio frequency module and the communication device according to the present disclosure are not limited to the embodiments and the variations thereof described above. The present disclosure also encompasses another embodiment achieved by combining arbitrary elements in the embodiments and the variations thereof, variations as a result of applying various modifications that may be conceived by those skilled in the art to the embodiments and the variations thereof without departing from the scope of the present disclosure, and various apparatuses that include the radio frequency module and the communication device according to the present disclosure.

For example, in the radio frequency modules and the communication devices according to the embodiments and the variations thereof, another circuit element and another line, for instance, may be disposed between circuit elements and paths that connect signal paths illustrated in the drawings.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as mobile phones, as a radio frequency module disposed in a front-end portion that supports multiband technology.

The invention claimed is:

1. A radio frequency module, comprising:
a first transmission power amplifier that includes a plurality of amplifying elements that are cascaded;
a first reception low noise amplifier; and
a module board on which the first transmission power amplifier and the first reception low noise amplifier are mounted, wherein
the plurality of amplifying elements include:
a first amplifying element disposed most downstream of the plurality of amplifying elements, and
a second amplifying element disposed upstream of the first amplifying element,
the module board includes a first principal surface and a second principal surface on opposite sides of the module board,
the first amplifying element is mounted on one of the first principal surface and the second principal surface,
the first reception low noise amplifier is mounted on a remaining one of the first principal surface and the second principal surface, and
in a plan view of the module board, the second amplifying element is physically disposed between the first amplifying element and the first reception low noise amplifier.

2. The radio frequency module according to claim 1, wherein
in a plan view of the module board, a conductive member is physically disposed between the first amplifying element and the first reception low noise amplifier.

3. The radio frequency module according to claim 2, wherein
the module board includes a first principal surface and a second principal surface on opposite sides of the module board, the first amplifying element is mounted on one of the first principal surface and the second principal surface,
the second amplifying element is also mounted on the one of the first principal surface and the second principal surface, and
the conductive member is the second amplifying element.

4. The radio frequency module according to claim 1, further comprising:
a common terminal;
a first transmission input terminal; and
a first reception output terminal, wherein the first transmission power amplifier is configured to amplify a transmission radio frequency signal input through the first transmission input terminal, and output the transmission radio frequency signal after amplification to the common terminal, and the first reception low noise amplifier is configured to amplify a reception radio frequency signal that is input through the common terminal, and output the reception radio frequency signal after amplification to the first reception output terminal.

5. The radio frequency module according to claim 4, wherein in a plan view of the module board, a conductive member is physically disposed between the first amplifying element and the first reception low noise amplifier, and the conductive member is one of:

a first switch configured to switch between conduction and non-conduction between the common terminal and the first transmission power amplifier;

a second switch configured to switch between conduction and non-conduction between the common terminal and the first reception low noise amplifier;

a transmission filter disposed on a transmission path that connects the common terminal and the first transmission power amplifier;

a reception filter disposed on a reception path that connects the common terminal and the first reception low noise amplifier;

a multiplexer disposed between the common terminal and the transmission filter and between the common terminal and the reception filter;

a metal chip;

a chip capacitor; and a control circuit configured to generate at least one of a control signal to adjust a gain of the first transmission power amplifier and a gain of the first reception low noise amplifier or a control signal to control the first switch and the second switch.

6. The radio frequency module according to claim 4, wherein in a plan view of the module board, a conductive member is physically disposed between the first amplifying element and the first reception low noise amplifier, and the module board includes a ground pattern and the conductive member includes an electrode connected to the ground pattern.

7. The radio frequency module according to claim 4, wherein the transmission radio frequency signal is in transmission band of a first communication band, the reception radio frequency signal is in a reception band of the first communication band, and the reception band of the first communication band includes (i) at least one of frequencies of harmonics of the transmission radio frequency signal, (ii) at least one of frequencies of intermodulation distortion resulting from amplification of the transmission radio frequency signal by the first transmission power amplifier and another radio frequency signal, or (iii) the at least one of the frequencies of the harmonics and the at least one of the frequencies of the intermodulation distortion.

8. The radio frequency module according to claim 4, wherein the transmission radio frequency signal is in a transmission band of a first communication band, the reception radio frequency signal is in a reception band of a second communication band different from the first communication band, the radio frequency module further comprises:

a second transmission input terminal;

a second reception output terminal;

a second transmission power amplifier configured to amplify another transmission radio frequency signal in the second communication band input through the second transmission input terminal, and output the another transmission radio frequency signal after amplification to the common terminal; and a second reception low noise amplifier configured to amplify another reception radio frequency signal in the first communication band input through the common terminal, and output the another reception radio frequency signal after amplification to the second reception output terminal, and the reception band of the second communication band includes (i) at least one of frequencies of harmonics of the transmission radio frequency signal, (ii) at least one of frequencies of intermodulation distortion resulting from amplification of the transmission radio frequency signal by the first transmission power amplifier and another radio frequency signal, or (iii) the at least one of the frequencies of the harmonics and the at least one of the frequencies of the intermodulation distortion.

9. The radio frequency module according to claim 1, wherein the module board includes a first principal surface and a second principal surface on opposite sides of the module board, the first amplifying element is mounted on one of the first principal surface and the second principal surface, and the second amplifying element is also mounted on the one of the first principal surface and the second principal surface.

10. The radio frequency module according to claim 1, wherein the second amplifying element is made of a conductive member.

11. A radio frequency module, comprising:

a first transmission power amplifier that includes a plurality of amplifying elements that are cascaded;

a first reception low noise amplifier; and a module board on which the first transmission power amplifier and the first reception low noise amplifier are mounted, wherein the plurality of amplifying elements include:

a first amplifying element disposed most downstream of the plurality of amplifying elements, and a second amplifying element disposed upstream of the first amplifying element, the module board includes a first principal surface and a second principal surface on opposite sides of the module board, the first amplifying element is mounted on one of the first principal surface and the second principal surface, and the second amplifying element is mounted on a remaining one of the first principal surface and the second principal surface.

12. A communication device, comprising:

a radio frequency (RF) signal processing circuit configured to process radio frequency signals transmitted and received by an antenna; and a radio frequency module configured to transfer the radio frequency signals between the antenna and the RF signal processing circuit, wherein the radio frequency module includes:
- a first transmission power amplifier that includes a plurality of amplifying elements that are cascaded,
- a first reception low noise amplifier, and
- a module board on which the first transmission power amplifier and the first reception low noise amplifier are mounted, the plurality of amplifying elements include:
- a first amplifying element disposed most downstream of the plurality of amplifying elements, and
- a second amplifying element disposed upstream of the first amplifying element, the module board includes a first principal surface and a second principal surface on opposite sides of the module board, the first amplifying element is mounted on one of the first principal surface and the second principal surface, the first reception low noise amplifier is mounted on a remaining one of the first principal surface and the second principal surface, and in a plan view of the module board, the second amplifying element is physically disposed between the first amplifying element and the first reception low noise amplifier.

13. The communication device of claim 12, wherein
in a plan view of the module board, a conductive member is physically disposed between the first amplifying element and the first reception low noise amplifier.

14. The communication device of claim 13, wherein
the module board includes a first principal surface and a second principal surface on opposite sides of the module board,
the first amplifying element is mounted on one of the first principal surface and the second principal surface,
the second amplifying element is also mounted on the one of the first principal surface and the second principal surface, and
the conductive member is the second amplifying element.

15. The communication device of claim 12, wherein the radio frequency module further comprises:
- a common terminal;
- a first transmission input terminal; and
- a first reception output terminal, wherein the first transmission power amplifier is configured to amplify a transmission radio frequency signal input through the first transmission input terminal, and output the transmission radio frequency signal after amplification to the common terminal, and the first reception low noise amplifier is configured to amplify a reception radio frequency signal that is input through the common terminal, and output the reception radio frequency signal after amplification to the first reception output terminal.

16. The communication device of claim 15, wherein
in a plan view of the module board, a conductive member is physically disposed between the first amplifying element and the first reception low noise amplifier, and the conductive member is one of
- a first switch configured to switch between conduction and non-conduction between the common terminal and the first transmission power amplifier;
- a second switch configured to switch between conduction and non-conduction between the common terminal and the first reception low noise amplifier;
- a transmission filter disposed on a transmission path that connects the common terminal and the first transmission power amplifier;
- a reception filter disposed on a reception path that connects the common terminal and the first reception low noise amplifier;
- a multiplexer disposed between the common terminal and the transmission filter and between the common terminal and the reception filter;
- a metal chip;
- a chip capacitor; and
- a control circuit configured to generate at least one of a control signal to adjust a gain of the first transmission power amplifier and a gain of the first reception low noise amplifier or a control signal to control the first switch and the second switch.

17. The communication device of claim 15, wherein
in a plan view of the module board, a conductive member is physically disposed between the first amplifying element and the first reception low noise amplifier, and
the module board includes a ground pattern and the conductive member includes an electrode connected to the ground pattern.

18. The communication device of claim 15, wherein
the transmission radio frequency signal is in transmission band of a first communication band,
the reception radio frequency signal is in a reception band of the first communication band, and
the reception band of the first communication band includes (i) at least one of frequencies of harmonics of the transmission radio frequency signal, (ii) at least one of frequencies of intermodulation distortion resulting from amplification of the transmission radio frequency signal by the first transmission power amplifier and another radio frequency signal, or (iii) the at least one of the frequencies of the harmonics and the at least one of the frequencies of the intermodulation distortion.

19. The communication device of claim 12, wherein
the module board includes a first principal surface and a second principal surface on opposite sides of the module board,
the first amplifying element is mounted on one of the first principal surface and the second principal surface, and
the second amplifying element is also mounted on the one of the first principal surface and the second principal surface.

20. The communication device according to claim 12, wherein
the second amplifying element is made of a conductive member.

* * * * *